US005370747A

United States Patent [19]

Noguchi et al.

[11] Patent Number: 5,370,747
[45] Date of Patent: Dec. 6, 1994

[54] PHOTOVOLTAIC DEVICE

[75] Inventors: Shigeru Noguchi, Hirakata; Hiroshi Iwata, Neyagawa; Keiichi Sano, Takatuki, all of Japan

[73] Assignee: Sanyo Electric Co., Ltd., Moriguchi, Japan

[21] Appl. No.: 980,451

[22] Filed: Nov. 23, 1992

[30] Foreign Application Priority Data

Nov. 25, 1991 [JP] Japan .................................. 3-309390
Feb. 25, 1992 [JP] Japan .................................. 4-037764

[51] Int. Cl.[5] .................... H01L 31/06; H01L 31/075; H01L 31/0236

[52] U.S. Cl. .................................... 136/259; 136/256; 136/258; 257/436; 257/458; 257/466

[58] Field of Search ............... 136/256, 258 AM, 259; 257/436, 458, 466

[56] References Cited

U.S. PATENT DOCUMENTS

| | | | |
|---|---|---|---|
| 4,434,318 | 2/1984 | Gibbons | 136/258 |
| 4,922,218 | 5/1990 | Watanabe et al. | 136/261 |
| 5,100,478 | 3/1992 | Kawabata | 136/249 |
| 5,136,351 | 8/1992 | Inoue et al. | 257/436 |

FOREIGN PATENT DOCUMENTS

| | | | |
|---|---|---|---|
| 1-77973 | 3/1989 | Japan | 136/259 |
| 1-106472 | 4/1989 | Japan | 136/259 |

OTHER PUBLICATIONS

IEEE Electron Device Lett., vol. EDL-4, No. 5, pp. 157-159; May 1983 (Iida et al).

Materials Research Society 1991 Annual Meeting: "Preparation of High-Quality a-SiGe:H Films with Low Impurity Concentration By the Hydrogen Dilution Method" (Sayama et al).

Technical Digest of the International PVSEC-5, Kyoto, Japan, 1990 pp. 43-46. (Zeman et al).

*Primary Examiner*—Aaron Weisstuch
*Attorney, Agent, or Firm*—W. G. Fasse; W. F. Fasse

[57] ABSTRACT

A photovoltaic device including a substrate, a first electrode layer provided on the substrate, a photoelectric conversion layer provided on the first electrode, and a second electrode layer provided on the photoelectric conversion layer. A discontinuous interfacial layer is provided at at least one of the interfaces between a first conductivity type layer and a photoactive layer provided in the photoelectric conversion layer, between the photoactive layer and a second, opposite conductivity type layer of the photoelectric conversion layer, and between the photoelectric conversion layer and the second electrode layer. The at least one interface provided with the discontinuous interfacial layer may be so textured that portions of the interface not provided with interfacial layers project toward the substrate.

23 Claims, 13 Drawing Sheets

PHOTOVOLTAIC DEVICE

BACKGROUND OF THE INVENTION

1. Field of the Invention

The present invention relates to a photovoltaic device for converting light energy to electrical energy.

2. Description of the Background Art

Among the factors for evaluating characteristics of a photovoltaic device, photoelectric conversion efficiency shows the degree of conversion of light energy to electrical energy.

In order to improve such photoelectric conversion efficiency, studies have generally been made relating to (1) optimizing the thickness of the semiconductor layer contributing most to photoelectric conversion and (2) reducing the electrical resistance of the electrodes.

Further, the shapes of the employed materials have also been studied for improving the photoelectric conversion efficiency. In other words, studies have been made of the texture morphology of interfaces between respective layers forming a photovoltaic device for improving the photoelectric conversion efficiency.

FIG. 13 is a sectional view showing a conventional photovoltaic device. Referring to FIG. 13, a transparent front electrode 2 which is formed by a transparent conductive film of tin oxide or the like is provided on a transparent substrate 1 of glass or the like. A photoelectric conversion layer 3 is provided on the front electrode 2. The interface 2a between the photoelectric conversion layer 3 and the front electrode 2 has a textured contour. The photoelectric conversion layer 3 is mainly formed of a p-type semiconductor layer 3p of an amorphous silicon carbide, a photoactive layer 3i of intrinsic amorphous silicon, and an n-type semiconductor layer 3n of amorphous silicon. In this photovoltaic device, a buffer layer 3b of amorphous silicon carbide is provided between the p-type semiconductor layer 3p and the photoactive layer 3i for improving interface characteristics. A back electrode 4 of aluminum or chromium is provided on the photoelectric conversion layer 3.

This photovoltaic device operates as follows:

Light 5 which is incident upon the photovoltaic device through the transparent substrate 1 passes through the front electrode 2, to enter the photoelectric conversion layer 3. At this time, the light 5 is so scattered by the textured surface 2a of the front electrode 2 that its traveling direction is bent by such scattering even if the light is incident perpendicularly to the surface of the transparent substrate 1.

As a result, the light 5 obliquely passes through the photoelectric conversion layer 3, whereby the optical path length thereof is so increased that a large amount of the light is absorbed by the photoelectric conversion layer 3. With respect to long wavelength light which is hardly absorbed in general and requires a relatively large optical path length for absorption, the amount of absorption is so increased as to improve the photoelectric conversion efficiency of the photovoltaic device.

*IEEE Electron Device Letters*, vol. EDL-4, No. 5, May 1983, pp. 157 to 159 describes in detail such a photovoltaic device which is provided with a front electrode 2 having a textured surface 2a.

In order to improve the degree of scattering in the aforementioned structure utilizing scattering caused by the textured shape of the interface 2a between the front electrode 2 and the photoelectric conversion layer 3, however, it is necessary to increase the thickness of the front electrode 2. The increase in thickness leads to increase in light loss based on light absorption by the material of the front electrode 2. Therefore, such a structure must be designed taking into account the balance between improvement of characteristics caused by light scattering and loss by light absorption.

In addition to the aforementioned optical path length, photoelectric conversion efficiency is influenced by recombination of carriers in the interface between semiconductor layers. In a photoelectric conversion layer, charge carriers are recombined at interfaces between semiconductor layers and the photoactive layer. Since p-type and n-type semiconductor layers are generally inferior in film quality to an intrinsic semiconductor layer of amorphous silicon, charge carriers such as electrons are easily recombined at interfaces formed by such semiconductor layers. In a photovoltaic device including such interfaces, therefore, carriers disappear to reduce photoelectric conversion efficiency. Such recombination of carriers is also caused at a junction between different types of materials, such as an interface between a metal back electrode and a photoelectric conversion layer, for example.

SUMMARY OF THE INVENTION

An object of the present invention is to provide a photovoltaic device with increased optical absorption and decreased recombination of charge carriers, thereby improving photoelectric conversion efficiency.

A photovoltaic device according to the present invention comprises a substrate, a first electrode layer which is provided on the substrate, a photoelectric conversion layer which is provided on the first electrode layer by successively stacking a first conductivity type layer, a photoactive layer, and a second opposite conductivity type layer, and a second electrode layer which is provided on the photoelectric conversion layer, a discontinuous interfacial layer being disposed at at least one of the interfaces between the first conductivity type layer and the photoactive layer, between the photoactive layer and the second, opposite conductivity type layer, and between the photoelectric conversion layer and the second electrode layer.

According to the present invention, the at least one discontinuous interfacial layer is provided at the interface between the photoactive layer and either the first or second conductivity type layer, to reduce the contact areas of the photoactive layer and the first and/or the second conductivity type layer. Such area reduction leads to a reduction in the degree of recombination of photo-generated carriers at the interfaces, whereby a larger amount of photo-generated carriers can be outputted with no recombination. Also, when such interfacial layers are provided between the photoelectric conversion layer and the electrode layer, it is possible to further reduce the degree of recombination of the photo-generated carriers, thereby improving photoelectric conversion efficiency.

The percent of the interfacial area occupied by such interfacial layers is preferably 30 to 70%, more preferably 50 to 70% of the overall interfacial area.

The interfacial layers are preferably several Å to 1 $\mu$m in thickness.

When the present invention is applied to a front side incidence type photovoltaic device, the substrate is a transparent substrate, while the first electrode layer serves as a front electrode layer and the second electrode layer serves as a back electrode layer, respectively.

When the present invention is applied to a back side incidence type photovoltaic device, on the other hand, the substrate is a non-transparent substrate, while the first electrode layer serves as a back electrode layer and the second electrode layer serves as a front electrode layer, respectively.

When one of the first conductivity type layer and the second, opposite conductivity type layer is formed by a p-type layer, the other one is formed by an n-type layer.

According to the present invention, the material for the interfacial layers is not particularly restricted, so far as the layers form no interfacial energy levels which trap and recombine charge carriers by coming into contact with the photoactive layer and the first or second conductivity type layer. For example, silicon dioxide, silicon nitride, or zinc oxide may be employed as the material for such interfacial layers.

According to the present invention, the interfacial layers are not particularly restricted in shape but may be provided in the form of films or grains.

According to the present invention, further, a buffer layer may be provided in the photoelectric conversion layer. Such a buffer layer may be provided between the photoactive layer and one of the first and second conductivity type layers.

According to one of the preferred modes of the present invention, the interface provided with the interfacial layers is so textured that portions of the interface not provided with interfacial layers project toward the substrate.

In a front side incidence type photovoltaic device employing a transparent substrate, at least one discontinuous interfacial layer is provided at the interface between the photoelectric conversion layer and a back electrode layer, and these interfaces are textured. When the interface between the photoactive layer and the first or second conductivity type layer has a textured shape, the back electrode layer stacked thereon is textured along the contour of the interface, whereby the interface between the photoelectric conversion layer and the back electrode layer is also textured. Whichever interface has a textured shape, therefore, the interface between the back electrode layer and the photoelectric conversion layer is textured. For light which is incident through the transparent substrate, the portion thereof passing through the photoelectric conversion layer with no absorption reaches the back electrode layer. Since the interface between the back electrode layer and the photoelectric conversion layer has a textured shape, this part of the light is scattered and reflected back into the photoelectric conversion layer. Thus, it is possible to increase substantially the optical path length of the incident light for increasing the amount of absorption of the light, thereby improving photoelectric conversion efficiency of the photovoltaic device. In particular, the absorption of long wavelength light, which requires a relatively large optical path length for absorption, is increased whereby the photoelectric conversion efficiency is improved.

Also, in a back side incidence type photovoltaic device employing a non-transparent substrate, the interface between the front electrode layer and the photoelectric conversion layer has a textured shape similarly to the aforementioned front side incidence type photovoltaic device. The path of light which is incident through the front electrode layer is bent by the textured surface of the front electrode layer, whereby the optical path length can be substantially increased in the photoelectric conversion layer. Also in this case, therefore, it is possible to increase the absorption of a long wavelength, thereby improving photoelectric conversion efficiency.

According to one of the preferred modes of the present invention, it is possible to reduce carrier recombination by interposition of the aforementioned interfacial layers as well as to further increase the optical path length in the photoelectric conversion layer, thereby further improving the photoelectric conversion efficiency by both effects. According to this preferred mode of the present invention, the textured shape of the interface can be easily defined by forming interfacial layers and thereafter selectively etching an underlayer using the interfacial layers as a mask during the manufacturing steps. Thus, it is possible readily to manufacture a photovoltaic device having improved photoelectric conversion efficiency without complicating the manufacturing steps.

When the interfacial layers are provided at the interface between a first or second conductivity type layer which is closer to the substrate and the photoactive layer, it is necessary to etch the first or second conductivity type layer to increase the thickness of the first or second conductivity type layer to some extent. When a reduction in thickness of the first or second conductivity type layer is desired, therefore, it is preferable not to carry out such etching step.

The foregoing and other objects, features, aspects, and advantages of the present invention will become more apparent from the following detailed description of the present invention when taken in conjunction with the accompanying drawings.

DESCRIPTION OF THE PREFERRED EMBODIMENTS

Figure 1:
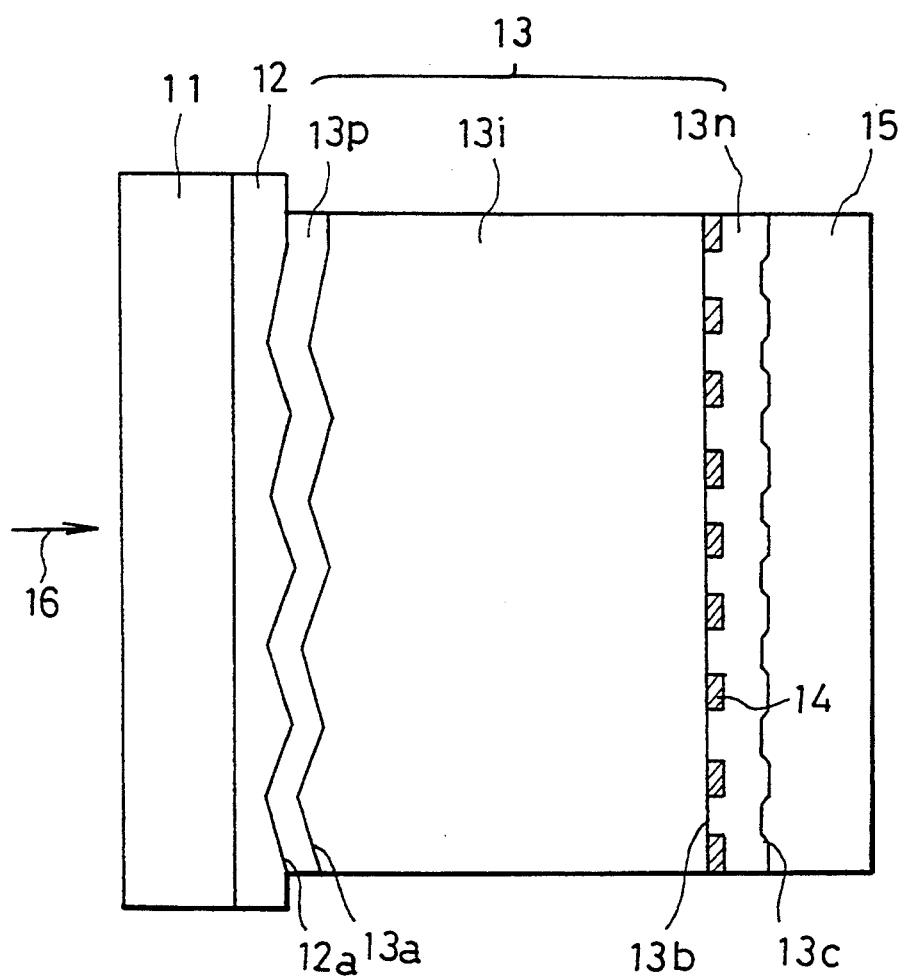
FIG. 1 is a sectional view showing a first embodiment of a front side incidence type photovoltaic device according to the present invention.

FIG. 1 shows an embodiment of a front side incidence type photovoltaic device employing a transparent substrate 11. A front electrode 12 is provided on the transparent substrate 11. The transparent substrate 11 is made of glass or quartz, while the front electrode 12, which is also transparent, is made of tin indium oxide, tin oxide, or zinc oxide. A photoelectric conversion layer 13, which is mainly formed by an amorphous silicon film, is provided on the front electrode 12. The photoelectric conversion layer 13 is formed by a p-type layer 13p which is provided on the front electrode 12, a photoactive layer 13i which is provided on the p-type conductive layer 13p, and an n-type conductive layer 13n which is provided on the photoactive layer 13i. The interface 12a between the front electrode 12 and the p-type layer 13p has a lesser texture than the interface 2a in the conventional photovoltaic device shown in FIG. 13. The interface 13a between the p-type layer 13p and the photoactive layer 13i also has a texture. The p-type layer 13p is formed by an amorphous silicon carbide film, while the photoactive layer 13i is made of intrinsic amorphous silicon and the n-type layer 13n is made of amorphous silicon.

A discontinuous interfacial layer 14 is disposed at the interface 13b between the photoactive layer 13i and the n-type layer 13n. Such interfacial layer 14 can be formed by a well known method such as sputtering or atmospheric pressure CVD. According to this embodiment, the interfacial layer 14 is made of silicon oxide.

A back electrode 15 is provided on the n-type layer 13n. The back electrode 15 can be made of a metal such as aluminum or chromium. According to this embodiment, the interface 13c between the n-type layer 13n and the back electrode 15 is slightly textured due to the texture of the interfacial layers 14 formed on the interface 13b.

According to this embodiment, light 16 which is incident upon the device through the transparent substrate 11 passes through the front electrode 12 and reaches the photoelectric conversion layer 13, and is partially absorbed therein. Then the remaining part of the light 16 passing through the photoelectric conversion layer 13 is reflected by the interface 13c, to re-enter the photoelectric conversion layer 13. According to this embodiment, the interface 13c defining the surface of the back electrode 15 is slightly textured that the light 16 is reflected by its textured surface in various directions. Thus, the optical path length of the light 16 is increased in the photoelectric conversion layer 13, so that a large amount of the light is absorbed.

A comparative sample of a photovoltaic device was prepared in a similar manner to the embodiment shown in FIG. 1, except that discontinuous interfacial layer 14 was not provided. The back electrode layer 15 of this sample had a flat surface.

A sample of the photovoltaic device shown in FIG. 1 and tile comparative sample were subjected to measurement of photoelectric conversion efficiency. The photoelectric conversion efficiency of the inventive sample was 12.0%, while that of the comparative sample was 11.1%. In the inventive sample, the photoelectric conversion efficiency was improved conceivably because portions of the interface 13b allowing direct contact of the photoactive layer 13i and the n-type layer 13n were reduced in area due to the interfacial layer 14 provided at the interface 13b, thereby reducing recombination of carriers, and absorption efficiency of the reflected light was increased by the textured shape of the surface 13c of the back electrode 15.

Figure 2:
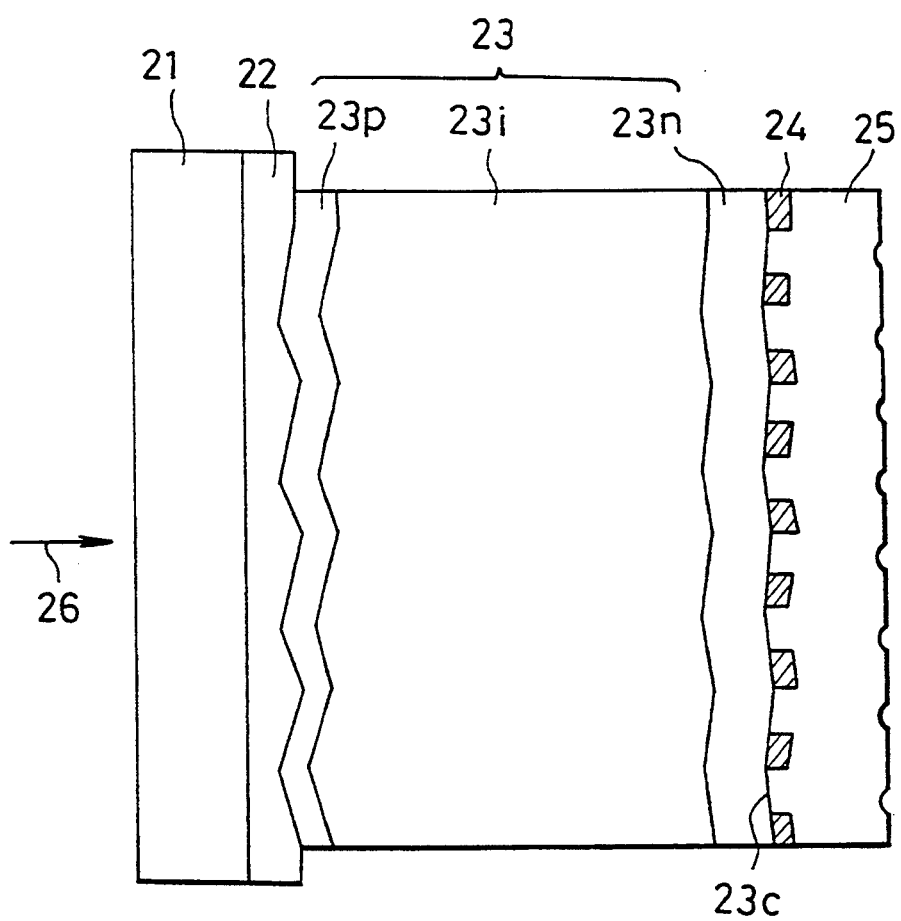
FIG. 2 is a sectional view showing a second embodiment of a front side incidence type photovoltaic device according to the present invention.

FIG. 2 shows a second embodiment of a front side incidence type photovoltaic device according to the present invention. Referring to FIG. 2, a discontinuous interfacial layer 24 is disposed at the interface 23c between an n-type layer 23n and a back electrode 25. As to the remaining elements, a front electrode 22 is provided on a transparent substrate 21 and a photoelectric conversion layer 23 is provided on the front electrode 22, similarly to the embodiment shown in FIG. 1. The photoelectric conversion layer 23 is formed by a p-type layer 23p, a photoactive layer 23i, and the n-type conductive layer 23n. Light 26 is incident this device through the transparent substrate 21.

Figure 3:
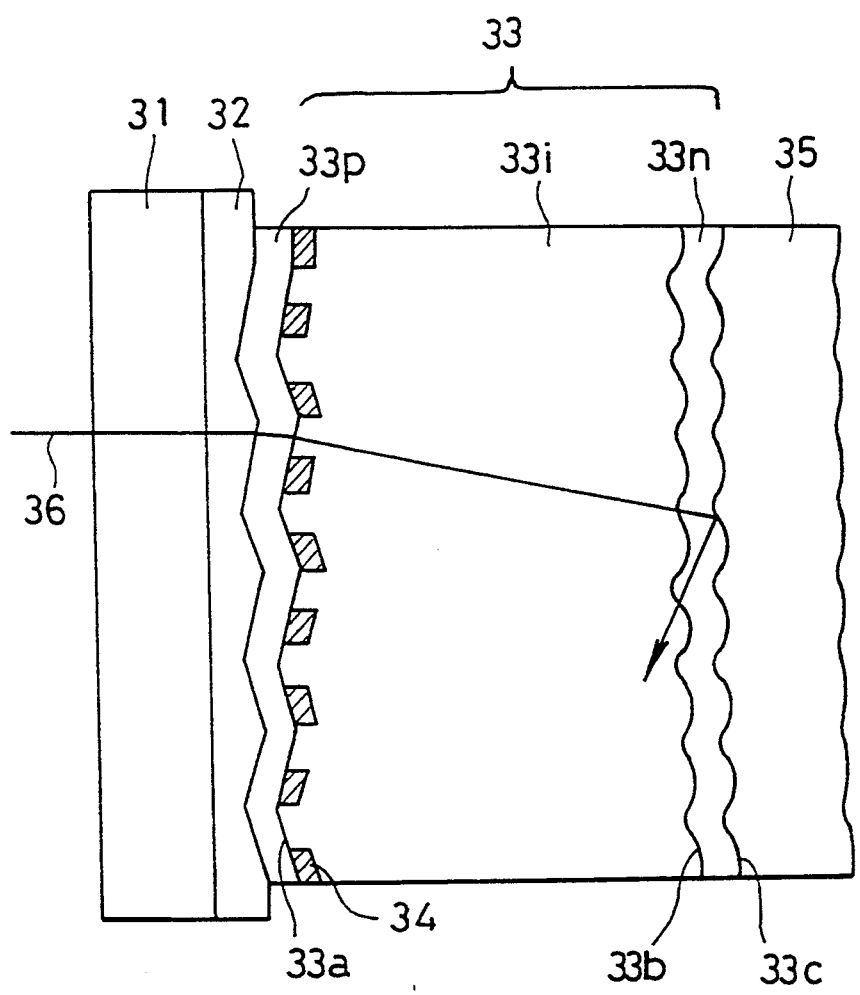
FIG. 3 is a sectional view showing a third embodiment of a front side incidence type photovoltaic device according to the present invention.

FIG. 3 shows a third embodiment of a front side incidence type photovoltaic device according to the present invention. Referring to FIG. 3, discontinuous interfacial layer 34 is disposed at the interface 33a between p-type layer 33p and photoactive layer 33i. As to the remaining elements, a front electrode 32 is provided on a transparent substrate 31 and a photoelectric conversion layer 33 is provided on the front electrode 32 while a back electrode 35 is provided on the photoelectric conversion layer 33, similarly to the embodiment shown in FIG. 1. Due to the interfacial layer 34 provided at the interface 33a, respective interfaces 33b and 33c between the photoactive layer 33i and the n-type layer 33n and between the n-type conductive layer 33n and the back electrode 35 are slightly textured. Light 36 incident the device through the transparent substrate 31 reaches the photoelectric conversion layer 33, and is reflected by the interface 33c defining the surface of the back electrode 35. The reflected light is scattered in various directions due to the textured shape of the interface 33c, whereby the optical path length thereof in the photoelectric conversion layer 33 is increased to improve photoelectric conversion efficiency. Since the interfacial layer 34 is provided at the interface 33a, recombination of photo-generated carriers at the interface 33a is reduced, whereby the photoelectric conversion efficiency is further improved.

Figure 4:
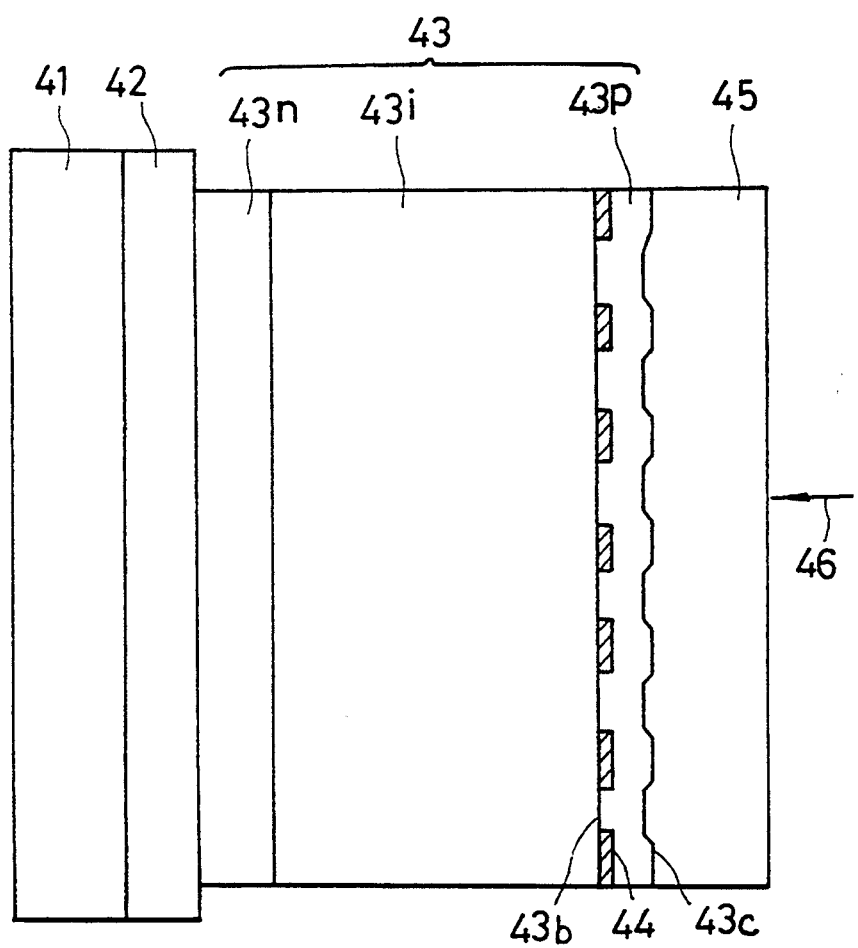
FIG. 4 is a sectional view showing an embodiment of a back side incidence type photovoltaic device according to the present invention.

FIG. 4 shows an embodiment of a back side incidence type photovoltaic device according to the present invention. Referring to FIG. 4, a back electrode 42 is provided on a non-transparent substrate 41 and a photoelectric conversion layer 43 is provided on the back electrode 42, while a transparent front electrode 45 is provided on the photoelectric conversion layer 43. The non-transparent substrate 41 is made of ceramics, for example, and the back electrode 42 is made of aluminum or silver, for example, while the front electrode 45 is made of indium tin oxide, for example. According to this embodiment, a discontinuous interfacial layer 44 is disposed at the interface 43b between a photoactive layer 43i and a p-type layer 43p. Due to the interfacial layer 44, the interface 43c between the front electrode 45 and the p-type layer 43p is slightly textured. As shown in FIG. 4, the photoelectric conversion layer 43 is formed by an n-type layer 43n, the photoactive layer 43i, and the p-type layer 43p. Light 46 incident the device through the front electrode 45 passes through the photoelectric conversion layer 43 and is reflected by the surface of the back electrode 42, to again pass through the photoelectric conversion layer 43.

Figure 5:
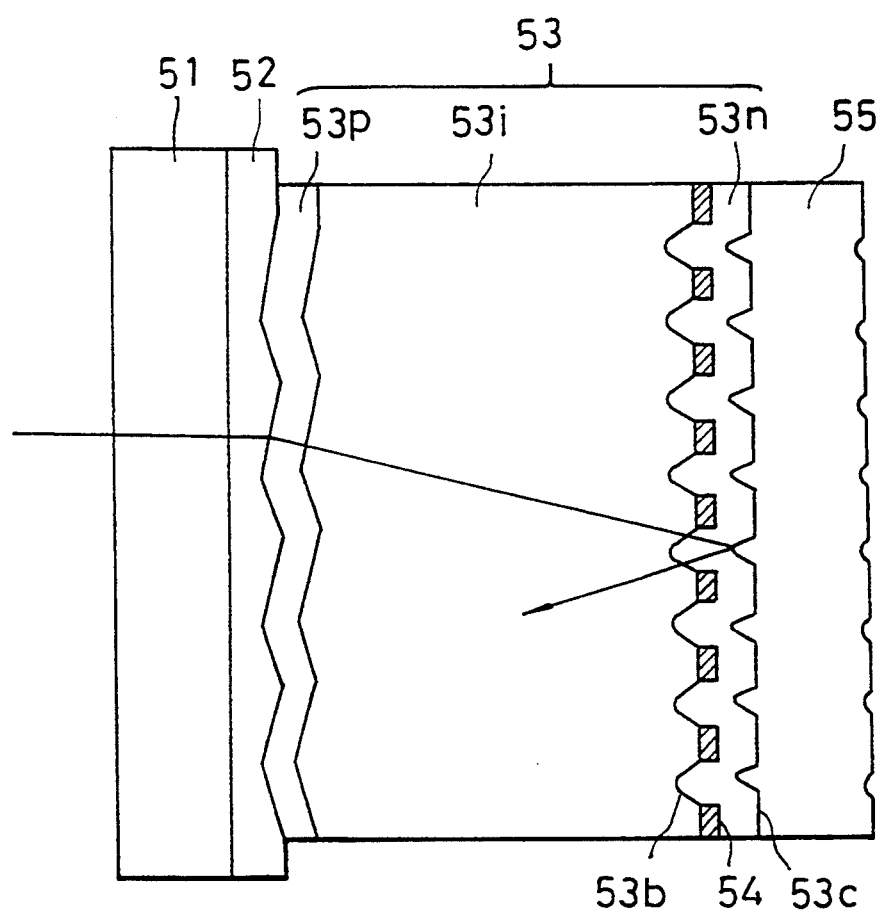
FIG. 5 is a sectional view showing a first embodiment of a front side incidence type photovoltaic device according to one of the preferred modes of the present invention.

FIG. 5 shows a photovoltaic device according to one of the preferred modes of the present invention. This photovoltaic device is of front side incidence type. A front electrode is provided on a transparent substrate 51, and has a textured surface. A photoelectric conversion layer 53 is provided on the front electrode 52. This photoelectric conversion layer 53 is formed by a p-type layer 53p, a photoactive layer 53i, and an n-type layer 53n. A discontinuous interfacial layer 54 is provided at the interface 53b between the photoactive layer 53i and the n-type layer 53n.

Portions of the interface 53b between the interfacial layer 54 project toward the transparent substrate 51. Such a textured shape of the interface 53b can be obtained by forming the interfacial layer 54 and thereafter selectively etching portions of the photoactive layer 53i not provided with interfacial layer 54 during the manufacturing steps, as hereinafter described.

The n-type layer 53n is provided on the photoactive layer 53i. Interface 53c defining the surface of the n-type layer 53n also has a textured shape, due to the influence of the textured surface of the interface 53b. A back electrode 55 is provided on the n-type layer 53n.

According to this embodiment, the interface 53b is so textured as to increase the degree of texturing of the interface 53c defining the surface of the back electrode 55. Thus, it is possible to increase reflection at the surface of the back electrode 55, thereby further improving the photoelectric conversion efficiency.

Figure 6:
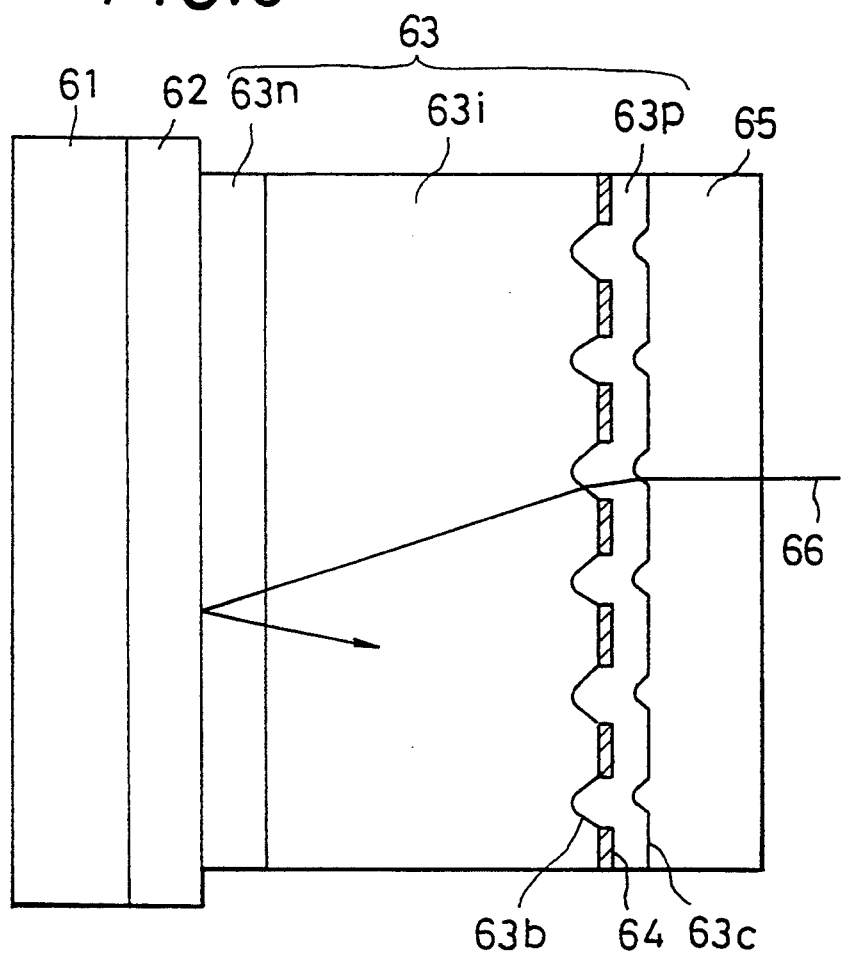
FIG. 6 is a sectional view showing a first embodiment of a back side incidence type photovoltaic device according to one of the preferred modes of the present invention.

FIG. 6 shows an embodiment of a back side incidence type photovoltaic device according to the present invention. Referring to FIG. 6, a back electrode 62 is provided on a non-transparent substrate 61, and a photoelectric conversion layer 63 is provided on the back electrode 62. A front electrode 65 is provided on the photoelectric conversion layer 63. The photoelectric conversion layer 63 is formed by an n-type layer 63n, a photoactive layer 63i, and a p-type layer 63p. According to this embodiment, a discontinuous interfacial layer 64 is provided at the interface 63b between the photoactive layer 63i and the p-type layer 63p. Regions of the interface 63b not provided with interfacial layer 64 project toward the non-transparent substrate 61. Such a texture shape of the interface 63b can be defined by etching during the manufacturing steps, similarly to the embodiment shown in FIG. 5. Due to such a textured shape of the interface 63b, the interface 63c between the front electrode 65 and the p-type layer 63p is also textured. Thus, light 66 incident the device through the front electrode 65 is scattered to travel through the photoelectric conversion layer 63. Thus, the optical path length is increased to improve photoelectric conversion efficiency. Due to the interfacial layer 64 provided at the interface 63b, recombination of carriers is reduced and the photoelectric conversion efficiency is further improved.

Figure 7:
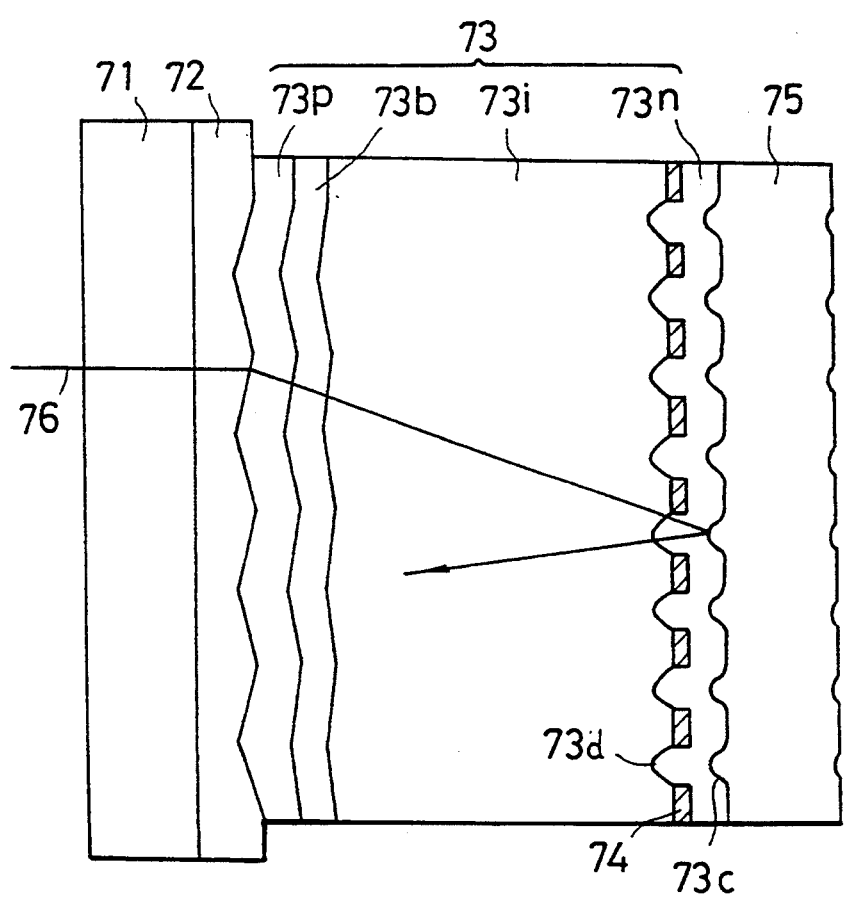
FIG. 7 is a sectional view showing a second embodiment of a front side incidence type photovoltaic device according to one of the preferred modes of the present invention.

FIG. 7 shows another embodiment of a front side incidence type photovoltaic device according to the present invention, which is similar to that shown in FIG. 5. Referring to FIG. 7, this embodiment is characterized in that a buffer layer 73b is provided between p-type layer 73p and photoactive layer 73i. This buffer layer 73b is adapted to improve interface characteristics of the p-type layer 73p and the photoactive layer 73i. The buffer layer 73b can be made of amorphous silicon carbide, for example.

Thus, a photoelectric conversion layer 73 is formed by the p-type layer 73p, the buffer layer 73b, the photoactive layer 73i, and the n-type layer 73n according to this embodiment. This photoelectric conversion layer 73 is provided on a front electrode 72, which is provided on a transparent substrate 71. A discontinuous interfacial layer 74 is provided at the interface 73 between the photoactive layer 73i and the n-type layer 73n. Portions of the interface 73d not provided with interfacial layer 74 project toward the transparent substrate 71. Such a texture of the interface 73d can be defined by etching during the manufacturing steps, similarly to the embodiments shown in FIGS. 5 and 6. An n-type layer 73n is formed on the interface 73d, while the interface 73c between the n-type layer 73n and back electrode 75 is textured due to the influence of the textured shape of the interface 73d. As shown in FIG. 7, therefore, light 76 incident the device through the transparent substrate 71 passes through the photoelectric conversion layer 73 and is irregularly reflected by the interface 73c defining the surface of the back electrode 75, whereby the optical path length is further increased in the photoelectric conversion layer 73.

Also in the embodiment shown in FIG. 7, photoelectric conversion efficiency is improved by the textured shape of the interface 73c and provision of the interfacial layer 74.

Figure 8A:
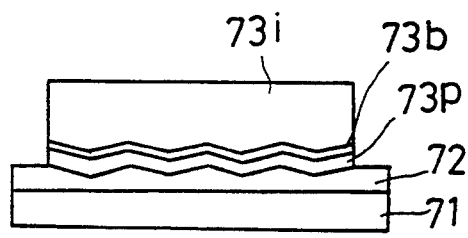
FIGS. 8A to 8E are sectional views showing the processes of manufacturing the photovoltaic device shown in FIG. 7.

FIGS. 8A to 8E are sectional views illustrating the manufacturing steps of the photovoltaic device shown in FIG. 7, Referring to FIG. 8A, a front electrode 72 is formed on a transparent substrate 71, and then a p-type layer 73p of about 100 Å in thickness, a buffer layer 73b, of about 100 Å in thickness, and a photoactive layer 73i of about 5000 Å in thickness are sequentially stacked by well-known plasma CFD processes.

Figure 8B:
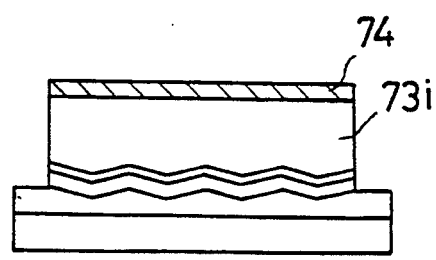

Referring to FIG. 8B, an interfacial layer 74 of silicon oxide is formed on the photoactive layer 73i by atmospheric pressure CVD. According to this embodiment, the interfacial layer 74 is about 500 Å in thickness.

Figure 8C:
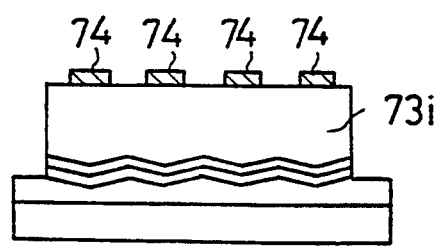

Referring to FIG. 8C, the as-formed interfacial layer 64 is selectively removed by etching through well-known photolithography employing a photoresist material, to obtain the discontinuous or island-like structure shown in FIG. 8C. The intervals between the islands of the interfacial layer 74 are preferably set in a range of 0.1 to 10 μm. According to this embodiment, such intervals are 0.4 μm.

Figure 8D:
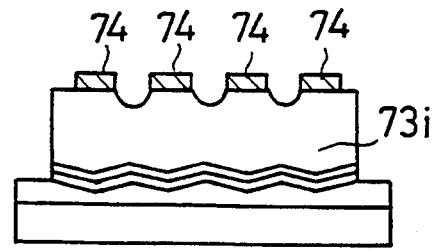

Referring to FIG. 8D, the surface of the photoactive layer 73i provided with the discontinuous interfacial layer 74 is exposed to hydrogen plasma, to be etched. The depth of such etching, which is preferably adjusted in a range of 500 to 4000 Å, is 2000 Å in this embodiment. Such treatment with hydrogen plasma is performed under conditions of an $H_2$ gas flow rate of 200 sccm, a reaction pressure of 0.3 Torr, a temperature of 190° C., and RF power of 40 W.

Due to such etching with hydrogen plasma, the surface of the photoactive layer 73i is textured as shown in FIG. 8D.

Figure 8E:
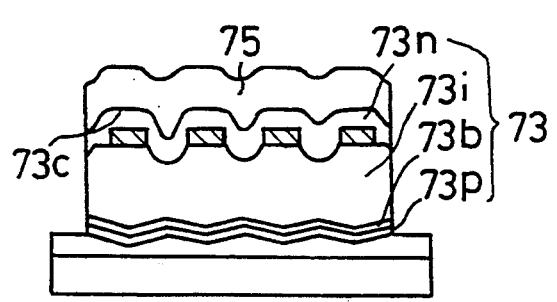

Referring to FIG. 8E, an n-type semiconductor layer 73n of about 200 to 300 Å in thickness is deposited on the photoactive layer 73i by plasma CVD. The surface of the n-type semiconductor layer 73n is also textured. A back electrode 75 of about 2000 Å in thickness is then formed on the n-type semiconductor layer 73n by evaporation.

In the photovoltaic device manufactured in the aforementioned manner, the interface 73c defining the interior surface of the back electrode 75 has a texture shape of about 1500 Å in height. In general, the texture shape of the back electrode is preferably about 1000 to 5000 Å in height.

Figure 9:
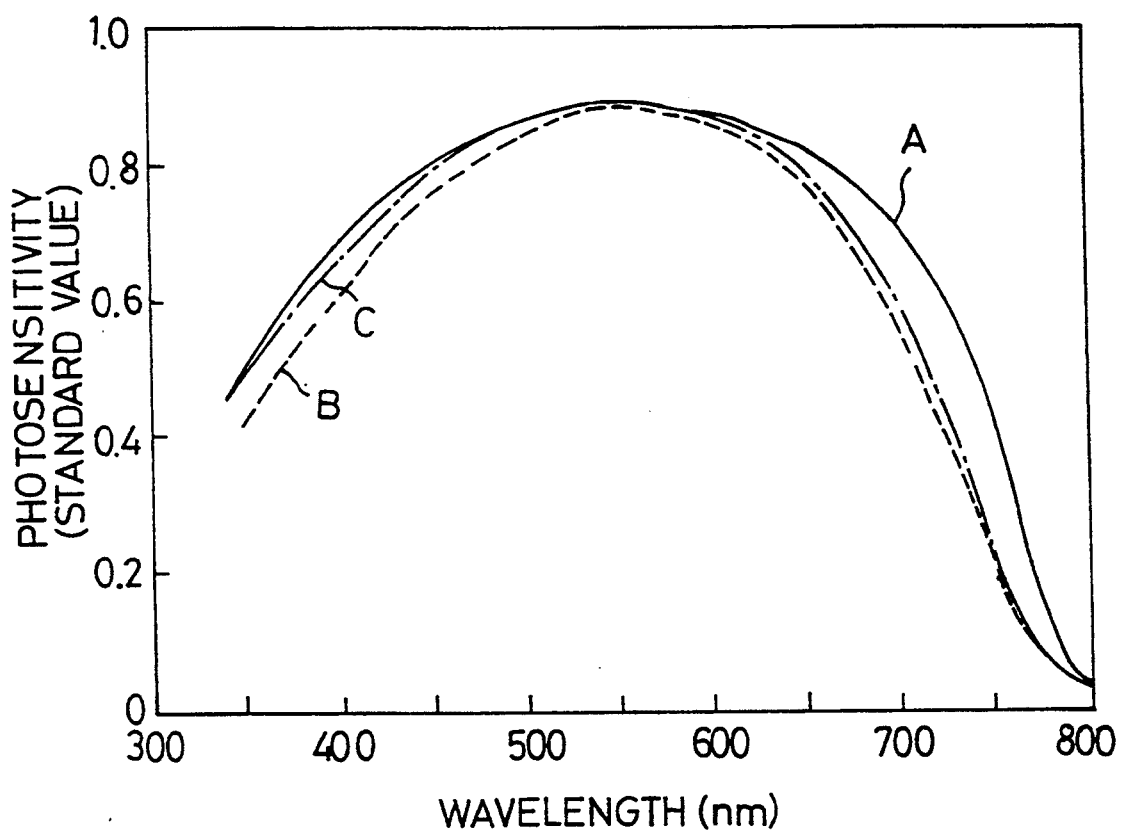
FIG. 9 shows the photosensitivity characteristics of the photovoltaic device shown in FIG. 7.
Figure 13:
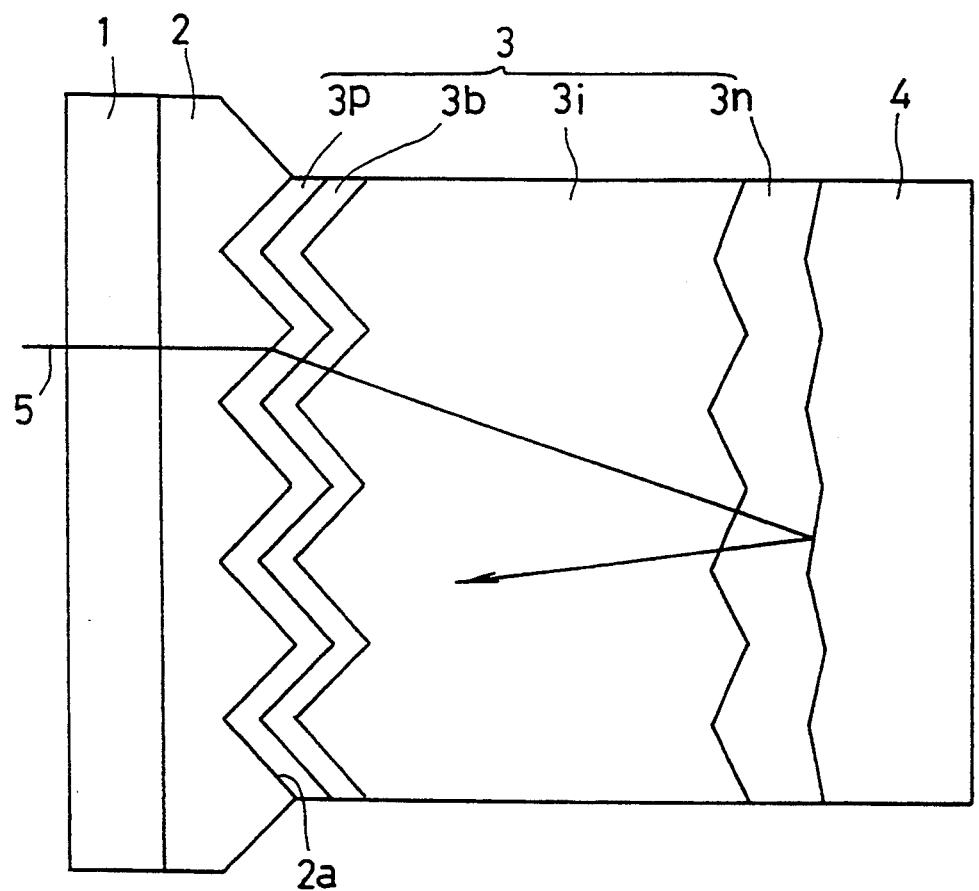
FIG. 13 is a sectional view showing a conventional photovoltaic device.

FIG. 9 shows photosensitivity spectra of an inventive photovoltaic device A manufactured in the aforementioned manner, the conventional photovoltaic device B shown in FIG. 13, and a comparative photovoltaic device C prepared by simply etching the surface of a photovoltaic layer 73i by hydrogen plasma without provision of interfacial layers 74.

As shown in FIG. 9, the inventive device A has higher photosensitivity for long wavelength light exceeding 600 nm in wavelength as compared with the other devices B and C. This is because the long wavelength light can be effectively absorbed by surface reflection at the back electrode 75 having a textured shape while the incident light is reflected also by the interfacial layer 74 provided between the photoactive layer 73i and the n-type semiconductor layer 73n to increase the amount of light absorption in the photoactive layer 73i as a result. In the photovoltaic device C having the photoactive layer 73i whose surface is textured only by treatment with hydrogen plasma, on the other hand, absorption of long wavelength light is only slightly increased due to insufficient texture shape of the surface.

In the photovoltaic devices A, B, and C, the front electrodes for receiving light have the same thickness of 9000 Å, while the front electrodes themselves are textured substantially to the same degree. In the inventive photovoltaic device A, the surface of the photoactive layer 73i is so textured as to attain a further efficient light scattering effect, whereas the front electrode may not be remarkably textured dissimilarly to the conventional photovoltaic device. Therefore, the degree of front electrode texturing may be reduced and the electrode itself can be reduced in thickness. Thus, it is possible to reduce light absorption loss based on light absorption by the front electrode, while improving sensitivity for short wavelength light.

Further, it is possible to suppress electrical short circuits across the front and back electrodes, which has been relatively frequently caused in general because of inferior texture shape, by reducing the texture shape of the front electrode.

Photoelectric conversion characteristics of the inventive and conventional photovoltaic devices A and B are now described. Table 1 shows such photoelectric conversion characteristics.

TABLE 1

|  | Device B | Device A |
| --- | --- | --- |
| Open-Circuit Voltage (V) | 0.90 | 0.90 |
| Short-Circuit Current (mA/cm²) | 17.30 | 18.80 |
| Curve Factor | 0.71 | 0.72 |

TABLE 1-continued

|  | Device B | Device A |
| --- | --- | --- |
| Conversion Efficiency | 11.10 | 12.20 |

As shown in Table 1, the short-circuit current of the inventive photovoltaic device A is larger than that of the conventional photovoltaic device B by 8.5%. As a result, the photoelectric conversion efficiency is improved by about 10% in the inventive photovoltaic device A.

Further, the characteristics of the inventive photovoltaic device A are improved on the basis of the aforementioned increase in amount of light absorption, as well as by reduction of carrier recombination caused by the discontinuous interfacial layer provided at the interface with the photoelectric conversion layer. In other words, the island-like interfacial layer is positioned at the relatively interior interface between the photoactive layer and the n-type semiconductor layer so as to reduce the areas of direct contact of these layers, thereby reducing the recombination of charge carriers. Such reduction of carrier recombination contributes to improvement of the fill factor and the open-circuit voltage characteristics of the photovoltaic device.

Figure 10:
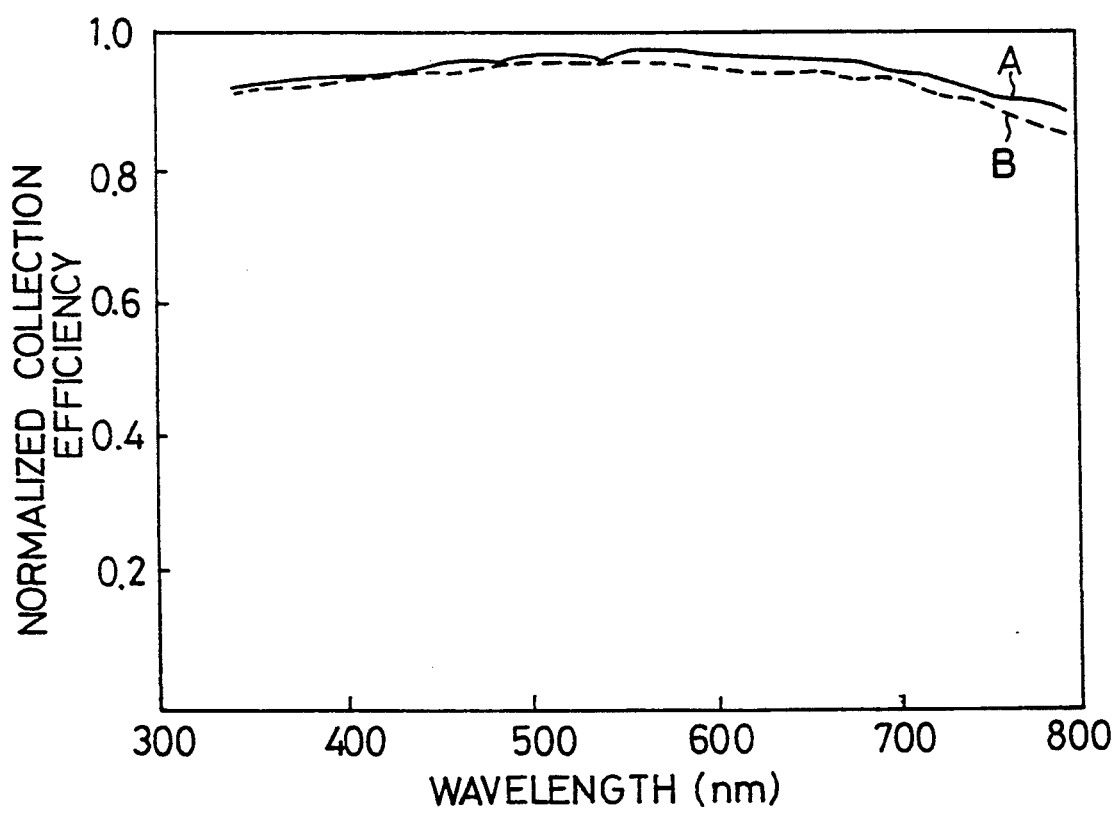
FIG. 10 shows the wavelength dependency of charge carrier collection efficiency of the photovoltaic device shown in FIG. 7.

FIG. 10 shows the wavelength dependency of charge carrier collection efficiency in the inventive and conventional photovoltaic devices A and B. The wavelength dependency is indicated by the ration $(I_0/I_{-5})$ of the photoelectric current $I_{-5}$ in a reverse-biased state $(-5\ V)$ to the photoelectric current $I_0$ in a zero-biased state $(0\ V)$ of each photovoltaic device irradiated with light of various wavelengths.

The value of the current in the reverse-biased state is employed as the reference value for normalization since most of the photogenerated charge carriers generated at respective wavelengths can be collected as a photoelectric current in such a state. Thus, charge carrier recombination is reduced as the ratio approaches 1.

As clearly shown in FIG. 10, the inventive photovoltaic device A is superior in carrier collection to the conventional photovoltaic device B in the wavelength of 350 to 800 nm.

Figure 11:
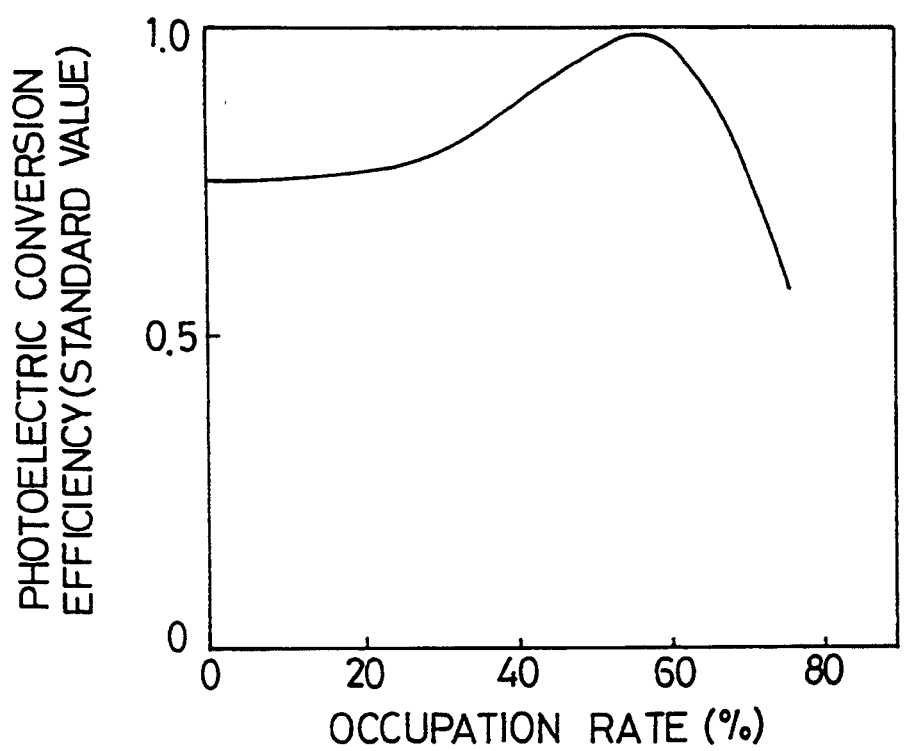
FIG. 11 shows the relation between the area occupation rate of the interfacial layers and photoelectric conversion efficiency of the photovoltaic device shown in FIG. 7.

FIG. 11 illustrates the relation between the areal percent of the interfacial layer occupying the interface between the photoactive layer and the n-type semiconductor layer, i.e., the area occupation rate, in the photovoltaic device according to the present invention and photoelectric conversion efficiency. When the occupation rate is less than 30%, the photoelectric conversion efficiency remains substantially constant at a value of 0.75, while the conversion efficiency is remarkably improved in a range of 30 to 50% of the occupation rate, as shown in FIG. 11. When the occupation rate exceeds about 50%, on the other hand, the photoelectric conversion efficiency is reduced and when the occupation rate exceeds about 70%, the photoelectric conversion efficiency is reduced as compared with a device not provided with an interfacial layer, i.e., an occupation rate of 0%. Therefore, the occupation rate of the interfacial layer is preferably 30 to 70%, and more preferably 50 to 70% in the present invention.

Such a change of the photoelectric conversion efficiency depending on the occupation rate conceivably results from the balance between improvement of the photoelectric conversion efficiency due to increase in number of collected charge carriers caused by reduction of carrier recombination and reduction of the photoelectric conversion efficiency caused by an increased in the distance of charge carrier movement required for carrier collection due to an excessive increase of the occupation rate.

According to the present invention, as hereinabove described, it is possible to improve photoelectric conversion efficiency remarkably. Reduction of charge carrier combination significantly contributes to such improvement, while an increase in optical path length caused by the texture shape of the electrode layer may also contribute to this.

Figure 12:
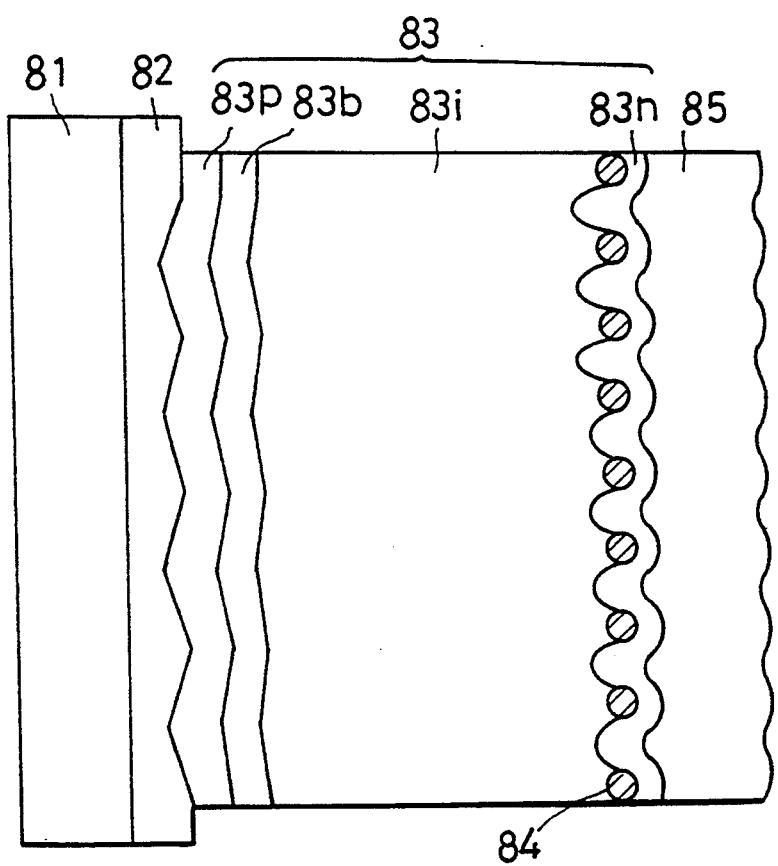
FIG. 12 is a sectional view showing a third embodiment of a front side incidence type photovoltaic device according to one of the preferred modes of the present invention.

FIG. 12 shows still another embodiment of a front side incidence type photovoltaic device according to the present invention, which is provided with a granular interfacial layer 84. Such interfacial layer 84 can be made of silicon oxide grains which are prepared by mechanically pulverizing glass or the like and sorting the obtained grains by size. In the photovoltaic device according to this embodiment, a photoactive layer 83i is formed and thereafter silicon oxide grains 84 are distributed on this photoactive layer 83i, to be interspersed on its surface. Then, surface regions of the photoactive layer 83i not provided with silicon oxide grains 84 are etched with a hydrogen plasma, whereby the photovoltaic device shown in FIG. 12 can be obtained. A front electrode 82 is provided on a transparent substrate 81, and a photoelectric conversion layer 83 is provided on the front electrode 82. A back electrode 85 is provided on the photoelectric conversion layer 83. The photoelectric conversion layer 83 is formed by a p-type layer 83p, a buffer layer 83b, a photoactive layer 83i, and an n-type layer 83n.

Although the interfacial layers are made of silicon oxide in each of the aforementioned embodiments, such interfacial layers may alternatively be made of silicon nitride or zinc oxide, to obtain a similar effect.

Although the p-type layer, the photoactive layer and the n-type layer are stacked in this order in the photoelectric conversion layer as viewed from the transparent substrate in each embodiment of the front side incidence type photovoltaic device, the present invention is not restricted to such order of stacking. For example, the n-type layer, the photoactive layer and the p-type layer may be stacked in this order as viewed from the transparent substrate, Also in the back side incidence type photovoltaic device, the order of stacking may be reversed. According to the present invention, the p-type layer, the photoactive layer, and the n-type layer may be made not only of amorphous silicon but of microcrystalline silicon containing crystal grains.

According to the present invention, further, the interfacial layer can be arranged between the photoelectric conversion layer and either electrode, or between the photoactive layer or the photoelectric conversion layer and either the p- or n-type layer.

Although the photoactive layer and the conductive layer are etched with hydrogen plasma in each of the aforementioned embodiments, the present invention is not restricted to this. For example, such layers can be chemically or physically etched with an inert gas such as helium or argon, or a reactive gas such as Freon gas of $CF_4$ or the like. Alternatively, the layers may be wet etched with a solution of KOH or the like.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A photovoltaic device comprising: a substrate; a first electrode layer provided on said substrate; a photoelectric conversion layer provided on said first electrode layer by successively stacking a first conductivity type layer, a photoactive layer, and a second, opposite conductivity type layer; a second electrode layer provided on said photoelectric conversion layer; and a discontinuous interfacial layer provided at at least one of the interfaces between said first conductivity type layer and said photoactive layer, between said photoactive layer and said second, opposite conductivity type layer, and between said photoelectric conversion layer and said second electrode layer, said at least one interface provided with said discontinuous interfacial layer being so textured that portions of said interface not provided with said discontinuous interfacial layer project toward said substrate.

2. The photovoltaic device of claim 1, wherein said substrate is transparent, said first electrode layer is a front electrode layer, and said second electrode layer is a back electrode layer.

3. The photovoltaic device of claim 1, wherein said substrate is non-transparent, said first electrode layer is a back electrode layer, and said second electrode layer is a front electrode layer.

4. The photovoltaic device of claim 1, wherein the area occupied by said at least one discontinuous interfacial layer is 30 to 70% of the overall area of said interface.

5. The photovoltaic device of claim 1, wherein the area occupied by said at least one discontinuous interfacial layer is 50 to 70% of the overall area of said interface.

6. The photovoltaic device of claim 1, wherein said interface has a textured shape defined by selectively etching a layer under said at least one discontinuous interfacial layer using said discontinuous interfacial layer as a mask after formation of said discontinuous interfacial layer.

7. The photovoltaic device of claim 1, wherein said at least one discontinuous interfacial layer is in the form of a film.

8. The photovoltaic device of claim 1, wherein said at least one discontinuous interfacial layer is in the form of grains.

9. The photovoltaic device of claim 1, wherein said at least one discontinuous interfacial layer comprises at least one compound selected from the group consisting of silicon dioxide, silicon nitride, and zinc oxide.

10. The photovoltaic device of claim 1, wherein a buffer layer is provided in said photoelectric conversion layer between said photoactive layer and at least one of said first conductivity type and said second, opposite conductivity type layers.

11. The photovoltaic device of claim 1, wherein said at least one discontinuous interfacial layer is interspersed at intervals of 0.1 to 10 μm.

12. The photovoltaic device claim 1, wherein the textured shape of said at least one interface is 50 to 4000 Å in height.

13. A photovoltaic device comprising: a substrate; a first electrode layer provided on said substrate; a photoelectric conversion layer provided on said first electrode layer by successively stacking a first conductivity type layer, a photoactive layer, and a second, opposite conductivity type layer; a second electrode layer provided on said photoelectric conversion layer; and a discontinuous interfacial layer provided at at least one of the interfaces between said first conductivity type layer and said photoactive layer and between said photoactive layer and said second, opposite conductivity type layer.

14. The photovoltaic device of claim 13, wherein said substrate is transparent, said first electrode layer is a front electrode layer, and said second electrode layer is a back electrode layer.

15. The photovoltaic device of claim 13, wherein said substrate is non-transparent, said first electrode layer is a back electrode layer, and said second electrode layer is a front electrode layer.

16. The photovoltaic device of claim 13, wherein the area occupied by said at least one discontinuous interfacial layer is 30 to 70% of the overall area of said interface.

17. The photovoltaic device of claim 13, wherein the area occupied by said at least one discontinuous interfacial layer is 50 to 70% of the overall area of said interface.

18. The photovoltaic device of claim 13, wherein said at least one discontinuous interfacial layer is in the form of a film.

19. The photovoltaic device of claim 13, wherein said at least one discontinuous interfacial layer is in the form of grains.

20. The photovoltaic device of claim 13, wherein said at least one discontinuous interfacial layer comprises at least one compound selected from the group consisting of silicon dioxide, silicon nitride, and zinc oxide.

21. The photovoltaic device of claim 13, wherein a buffer layer is provided in said photoelectric conversion layer between said photoactive layer and at least one of said first conductivity type and said second, opposite conductivity type layers.

22. The photovoltaic device of claim 13, wherein said at least one discontinuous interfacial layer is interspersed at intervals of 0.1 to 10 $\mu$m.

23. The photovoltaic device of claim 13, wherein said at least one discontinuous interfacial layer is so interspersed as to make said interface between said photoelectric conversion layer and said second electrode layer irregular.

* * * * *